(12) United States Patent
Mahler et al.

(10) Patent No.: US 9,313,897 B2
(45) Date of Patent: Apr. 12, 2016

(54) METHOD FOR ELECTROPHORETICALLY DEPOSITING A FILM ON AN ELECTRONIC ASSEMBLY

(75) Inventors: Joachim Mahler, Regensburg (DE); Manfred Mengel, Bad Abbach (DE); Khalil Hosseini, Weihmichl (DE); Franz-Peter Kalz, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 731 days.

(21) Appl. No.: 13/620,202

(22) Filed: Sep. 14, 2012

(65) Prior Publication Data

US 2014/0076613 A1 Mar. 20, 2014

(51) Int. Cl.
| | |
|---|---|
| H05K 3/30 | (2006.01) |
| H05K 3/28 | (2006.01) |
| H01L 23/495 | (2006.01) |
| H01L 21/56 | (2006.01) |
| H01L 23/31 | (2006.01) |
| H01L 23/00 | (2006.01) |

(52) U.S. Cl.
CPC .............. *H05K 3/284* (2013.01); *H01L 21/56* (2013.01); *H01L 23/49586* (2013.01); *H01L 24/84* (2013.01); *H01L 24/85* (2013.01); *H01L 23/3107* (2013.01); *H01L 24/37* (2013.01); *H01L 24/40* (2013.01); *H01L 24/45* (2013.01); *H01L 24/48* (2013.01); *H01L 24/73* (2013.01); *H01L 2224/2919* (2013.01); *H01L 2224/32245* (2013.01); *H01L 2224/37124* (2013.01); *H01L 2224/37139* (2013.01); *H01L 2224/37144* (2013.01); *H01L 2224/37147* (2013.01); *H01L 2224/40245* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/73263* (2013.01); *H01L 2224/73265* (2013.01); *H01L 2224/83191* (2013.01); *H01L 2224/83192* (2013.01); *H01L 2224/8492* (2013.01); *H01L 2224/8592* (2013.01); *H01L 2224/92246* (2013.01); *H01L 2224/92247* (2013.01); *H01L 2924/01322* (2013.01); *H01L 2924/1301* (2013.01); *H01L 2924/1305* (2013.01);

(Continued)

(58) Field of Classification Search
CPC ... H01L 23/49586; H01L 21/56; H01L 24/85; H01L 2924/1301; H01L 2924/351; H01L 2224/40245; H01L 2224/37144; H01L 23/3107; H01L 24/37; H01L 24/40; H01L 24/45; H01L 24/48; H01L 24/73; H05K 3/284
USPC ............ 29/830, 832, 840, 841; 174/255–261; 204/485, 489; 257/678, 786, 790–793; 438/106, 758, 780
See application file for complete search history.

(56) References Cited

U.S. PATENT DOCUMENTS 3,911,475 A * 10/1975 Szedon et al. ................ 257/790
4,695,515 A 9/1987 Shirai et al.

(Continued)

*Primary Examiner* — Donghai D Nguyen
(74) *Attorney, Agent, or Firm* — Slater & Matsil, L.L.P.

(57) ABSTRACT

A packaged component and a method for making a packaged component are disclosed. In an embodiment the packaged component includes a component carrier having a component carrier contact and a component disposed on the component carrier, the component having a component contact. The packaged component further includes a conductive connection element connecting the component carrier contact with the component contact, an insulating film disposed directly at least on one of a top surface of the component or the conductive connection element, and an encapsulant encapsulating the component carrier, the component and the enclosed conductive connection elements.

14 Claims, 7 Drawing Sheets

(52) U.S. Cl.
CPC ............... *H01L2924/13055* (2013.01); *H01L 2924/13091* (2013.01); *H01L 2924/181* (2013.01); *H01L 2924/351* (2013.01); *H05K 2203/135* (2013.01); *Y10T 29/49144* (2015.01)

(56) References Cited

U.S. PATENT DOCUMENTS

| | | | |
|---|---|---|---|
| 5,196,098 A | 3/1993 | Rodriguez et al. | |
| 5,607,818 A | 3/1997 | Akram et al. | |
| 6,031,279 A | 2/2000 | Lenz | |
| 7,329,617 B2 * | 2/2008 | Li et al. | 438/780 |
| 7,821,128 B2 | 10/2010 | Ewe et al. | |
| 8,049,338 B2 | 11/2011 | Delgado et al. | |
| 8,178,390 B2 * | 5/2012 | Mahler et al. | 438/106 |
| 2007/0045745 A1 | 3/2007 | Ewe et al. | |
| 2007/0176303 A1 | 8/2007 | Murai et al. | |
| 2007/0216274 A1 | 9/2007 | Schultz et al. | |
| 2007/0235810 A1 | 10/2007 | Delgado et al. | |
| 2011/0159296 A1 | 6/2011 | Maenaka et al. | |
| 2012/0208325 A1 | 8/2012 | Chung | |

* cited by examiner

METHOD FOR ELECTROPHORETICALLY DEPOSITING A FILM ON AN ELECTRONIC ASSEMBLY

TECHNICAL FIELD

The present invention relates generally to a packaging method of an electric component, and in particular to electrophoretic deposition (EPD) coating of a film.

BACKGROUND

The necessity to provide smaller, thinner, lighter, cheaper electronic systems with reduced power consumption, more diverse functionality and improved reliability has driven a stream of technological innovations in all technical fields involved. This is certainly also true for the areas of assembly and packaging which provide protective enclosure against mechanical and thermal outside influences, as well as chemical or irradiation-induced attacks.

SUMMARY OF THE INVENTION

In accordance with an embodiment a packaged component comprises a component carrier comprising a component carrier contact and a component disposed on the component carrier, the component comprising a component contact. The packaged component further comprises a conductive connection element connecting the component carrier contact with the component contact, an insulating film disposed directly at least on one of a top surface of the component or the conductive connection element, and an encapsulant encapsulating the component carrier, the component and the enclosed conductive connection elements.

In accordance with an embodiment a method for manufacturing a system comprises electrophoretic depositing an insulating film on a component carrier, attaching a component to the component carrier by placing an adhesive layer of the component to the insulating film of the carrier and encapsulating the component and the component carrier.

In accordance with an embodiment a method for manufacturing a system comprises placing a component on a component carrier, connecting a component contact of the component to a component carrier contact of the component carrier and electrophoretic depositing an encapsulation material thereby encapsulating the component and the component carrier.

In accordance with an embodiment a method for manufacturing a system comprises placing a component on a component carrier and connecting a conductive connection element to a component contact of the component and to a component carrier contact of the component carrier. The method further comprises electrophoretic depositing an insulating film at least on one of a top surface of the component and the conductive connection element, and encapsulating the component.

In accordance with an embodiment a method for manufacturing a system comprises placing a component on a leadframe, connecting a metal clip to a component contact of the component and to a lead of the leadframe, isolating metal surfaces on the component, the metal clip and the leadframe by electrophoretic depositing a polymer on the metal surfaces and encapsulating the component, the metal clip and the leadframe.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely electrophoretic deposition (EPD) of a polymer on a system (e.g., component/component carrier) or portions thereof. Embodiments of the invention may also be applied, however, to other electrochemical deposition processes such as the electrochemical deposition of material layers. For example, embodiments of the invention may also be applied to electroplating processes.

Figure 1:
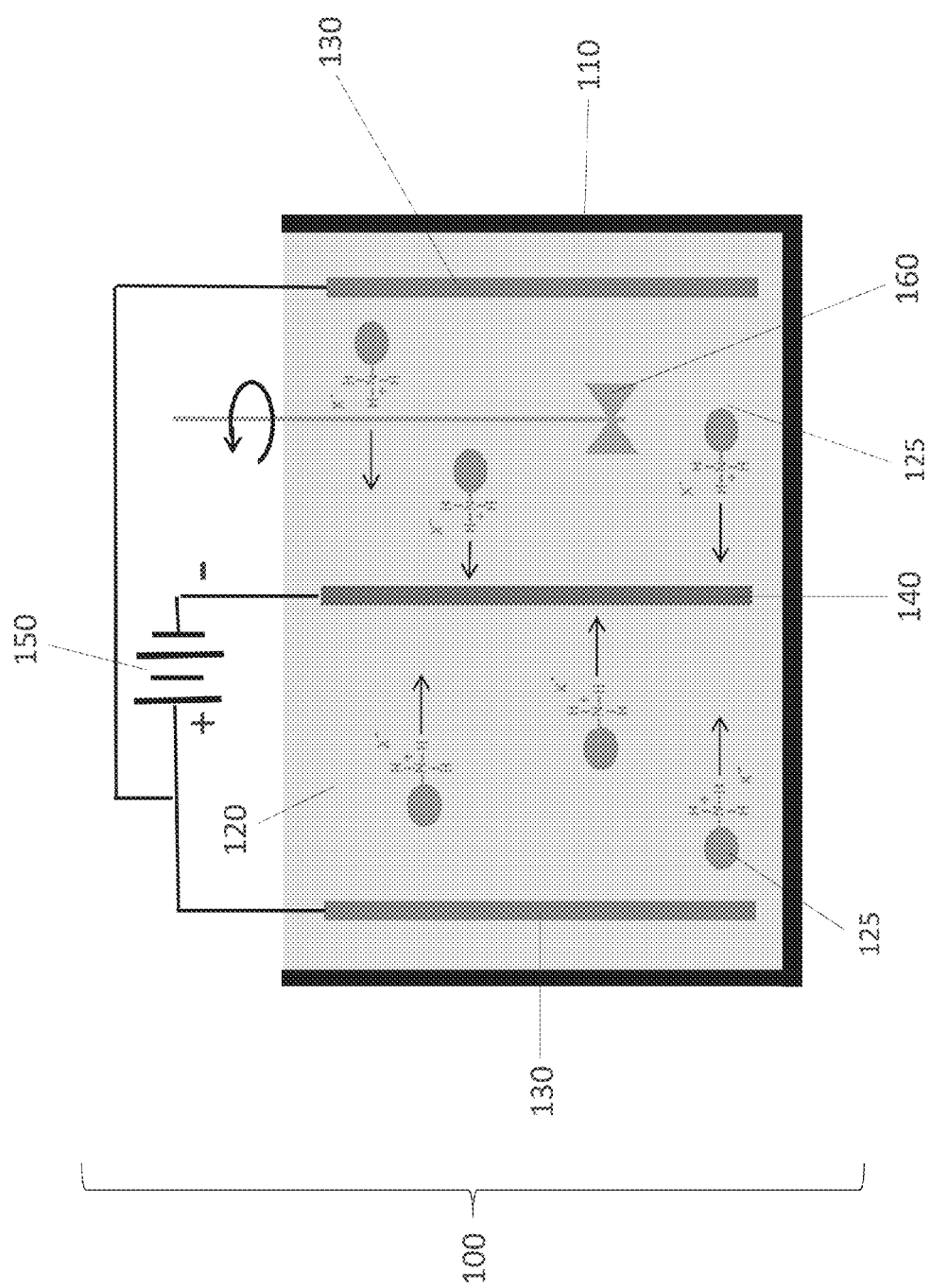
FIG. 1 illustrates an electrophoretic deposition (EPD) process tool.

FIG. 1 shows an example of an electrophoretic deposition (EPD) process tool 100 which is used to deposit an insulating layer on a workpiece. The EPD process tool 100 comprises a reactor chamber 110 (e.g., a bath) which is filled with a liquid medium 120. A first electrode (e.g., cathode) 140 is positioned in the center of the reactor chamber 110 where the EPD occurs. Two second electrodes (e.g., anodes) 130 are located in equal distances from the first electrode 140 in peripheral regions of the reactor chamber 110. A direct current (DC) power supply 150 is in conductive contact to the first electrode 140 and the second electrodes 130. The DC power provides the electric field to initiate and maintain the movement of positively charged particles 125 moving towards the first electrode 140. The charged particles 125 are polymer molecules comprising amino groups which may have been protonated due to the presence of a low concentration of weak acid in the EPD process tool 100. In order to avoid sedimentation and to ensure uniform polymer deposition the liquid medium 120 is continuously stirred and a constant temperature is maintained by a temperature stabilizing system (not shown).

A workpiece is disposed on the first electrode 140 or clamped between clamps forming the first electrode 140. Under the influence of the electric field the polymer molecules 125 deposit on the first electrode 140 and form a perfectly uniform polymer layer. The charged polymer molecules 125 subsequently discharge to form a coherent uncharged polymer layer or polymer coating (insulating layer/coating). The polymer coating exhibits high thickness uniformity even when deposited on complex structures with difficult-to-reach surface portions. The polymer may be selectively coated to specific areas of the workpiece or over the entire workpiece.

The initially high deposition rate of charged polymer molecules 125 may eventually slow down due to the increased insulation of the deposited insulating polymer coating. Thus, the EPD processes may be self-limiting to a certain extent.

Figure 2:
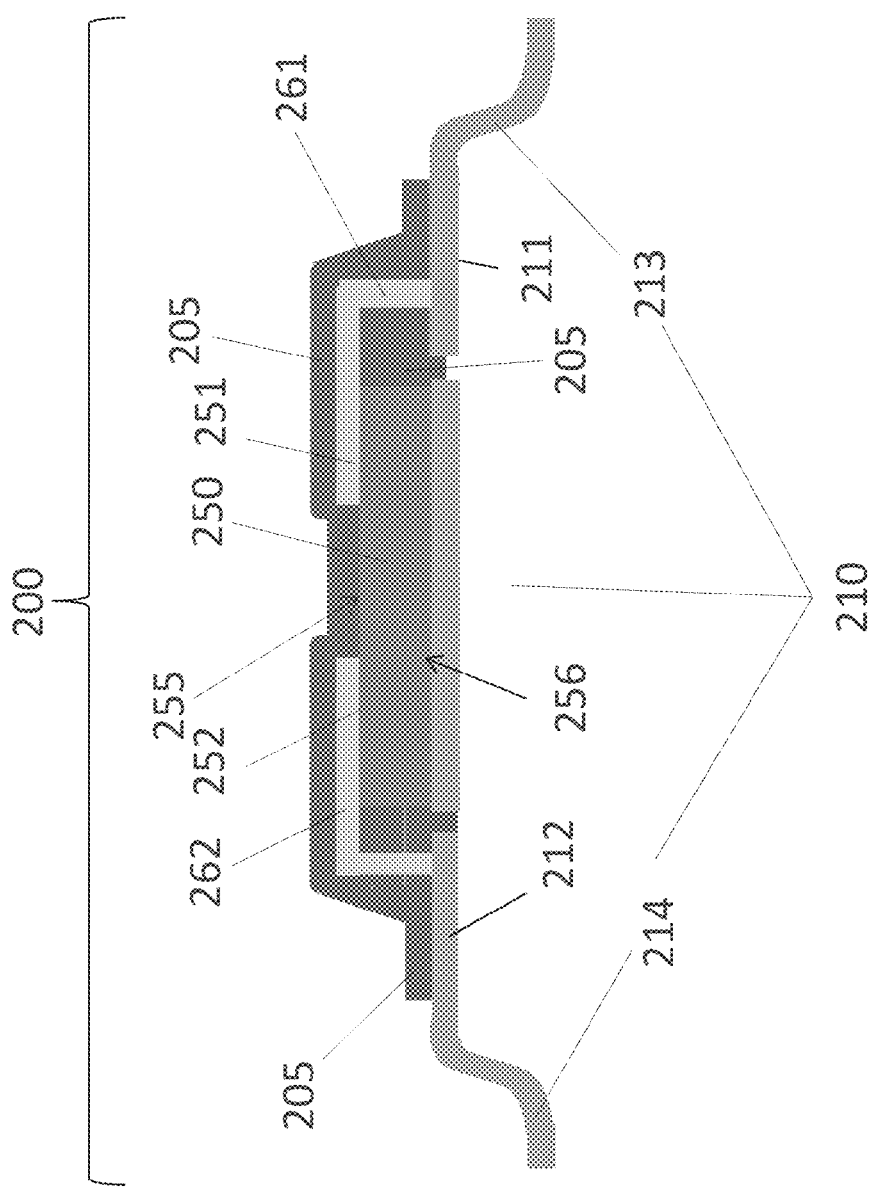
FIG. 2 illustrates in cross-sectional view of an embodiment of a packaged component.

FIG. 2 illustrates a cross-sectional view of an embodiment of packaged component 200 comprising an encapsulation based on electrophoretic deposition (EPD). The packaged component 200 comprises a component 250 and a component carrier 210.

The component 250 comprises a first main surface or top surface 255 and a second main surface or bottom surface 256. The top surface 255 may be the front side of the component 250 and the bottom surface 256 may be the back side of the component 250. In one embodiment, the first main surface 255 is the surface where the active areas are predominately disposed and the second main surface 256 is the surface which is active area free or which is predominately active area free.

The component 250 comprises a substrate. The substrate may be a semiconductor substrate such as silicon or germanium, or a compound substrate such as SiGe, GaAs, InP, GaN or SiC, or alternatively, other materials. The substrate may be doped or undoped and may comprise one or more wells. The substrate may comprise a thickness of about ≤20 µm or about ≤50 µm. The semiconductor substrate may be a single crystal silicon or a silicon-on insulator (SOI). One or more interconnect metallization layers may be arranged on the substrate. A passivation layer is disposed on the interconnect metallization layers to electrically isolate and structure component contact pads of the component 250.

The component 250 may be a chip or die. The component 250 may comprise a discrete device such as a single semiconductor device or an integrated circuit (IC). For example, the component 250 may comprise a semiconductor device such as a MOSFET or a power semiconductor device such as a bipolar transistor, an insulated gate bipolar transistor (IGBT), a power MOSFET, a thyristor or a diode. Alternatively, the component 250 may be a resistor, a protective device, a capacitor, a sensor or a detector, for example. The component may be a system on chip (SoC). In one embodiment the component 250 comprises a discrete device such as a transistor, wherein the top surface 255 comprises a source and the bottom surface 256 comprises a drain. Alternatively, the top surface 255 comprises a drain and the bottom surface 256 comprises a source. Yet in a further embodiment, the top surface 255 comprises a source, drain and electrode.

The component carrier 210 may be a workpiece, a substrate, a leadframe, or a printed circuit board (PCB). In one embodiment the component carrier 210 is a leadframe comprising a metal such as copper (Cu) or a copper alloy, nickel (Ni) or nickel alloy, silver (Ag) or silver alloys, or a combination thereof.

The component 250 is attached to the component carrier 210 at the component placement area. For example, the bottom surface 256 of the component is attached to the top surface of the component carrier 210. In one embodiment the component 250 is bonded to the component carrier 210 via a solder layer, a eutectic bonding layer or an epoxy bonding layer. Alternatively, the component 250 is bonded or glued to the component carrier by an adhesive tape or a conductive tape. In one embodiment the connection between the component 250 and the component carrier 250 is an electrical contact. Alternatively, the connection is an insulating barrier layer.

The packaged component 200 further comprises conductive connection elements 261, 262 such as conductive clips or wire bonds. For example, component contacts or component contact pads 251, 252 disposed on a top surface 255 of the component 250 are bonded to component carrier contacts or component carrier contact pads 211, 212 on the component carrier 210. Conductive clips 261, 262 may connect the component contact pads 251, 252 with the component carrier contact pads 211, 212. The conductive clips 261, 262 may be attached to the sidewalls of the component 250. Alternatively, the conductive clips 261, 262 may be spaced from the sidewalls of the component 250 with a small distance. The conductive clips may comprise a metal such as aluminum (Al), copper (Cu), silver (Ag) or gold (Au). Alternatively, the conductive clips may be wires.

The packaged device 200 further comprises an encapsulation 205. The encapsulation 205 is formed by an electrophoretic deposition (EPD). The encapsulation encapsulates the component 250, the conductive connection elements 261, 262 and the component carrier 210. Portions 213, 214 of the component carrier 210 may not be encapsulated.

The encapsulation material 205 of the packaged device 200 may comprise a polymer. For example, the polymer may comprise acrylic resins, polyurethane resins, epoxies, epoxies with an anime type hardener or polar high performance thermoplastics. Alternatively, the encapsulation material 205 of the packaged device 200 may comprise a monomer. Suitable monomers may comprise at least one functional group such as an amine-structure, an acid-structure, a carbonyl-structure, a sulfonate-structure, an isocyanate-structure or a hydroxyl-structure.

In one embodiment the component 250 may be a thin component 250 or an ultra-thin component 250. For example, the component 250 may comprise a thickness of less than about 20 µm or a thickness between about 20 µm and about 50 µm. The corresponding encapsulation 205 may comprise a thickness of below about 20 µm or alternatively a layer thickness of about 20 µm to about 50 µm. For components 250 with a larger thickness, the encapsulation comprises a thickness of up to about 500 µm.

Figure 3:
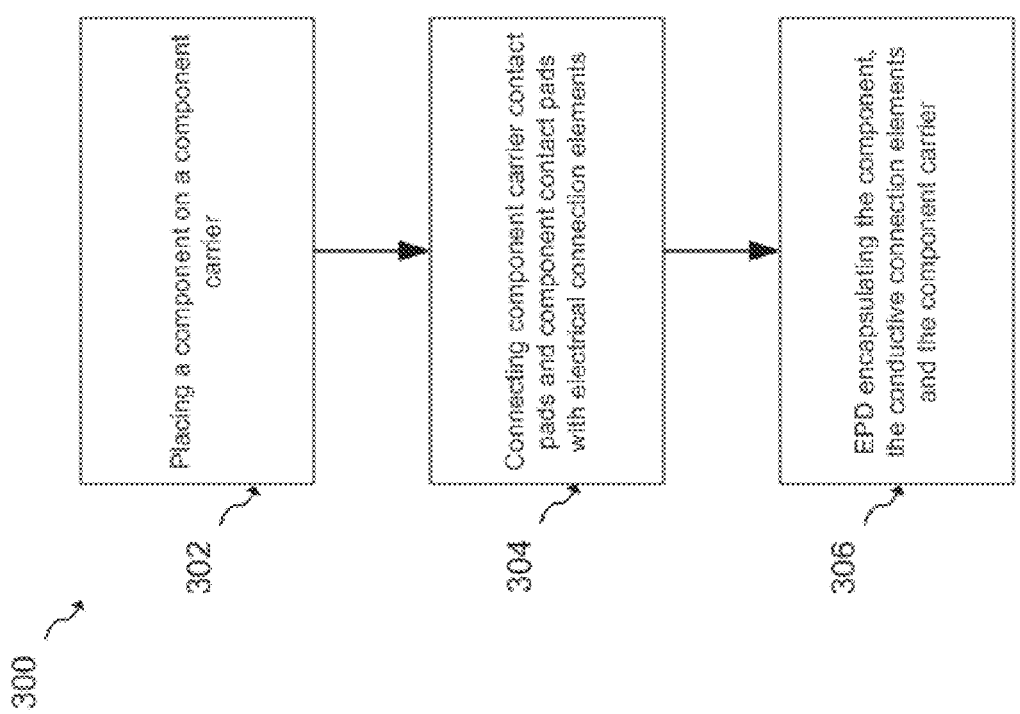
FIG. 3 illustrates an embodiment of a method for manufacturing a packaged component.

FIG. 3 shows an embodiment of a method to manufacture a packaged component 300. In a first step 302, a component is placed on and attached to a component carrier. The component and the component carrier may be the same as described with respect to FIG. 2.

The component is attached to the component carrier at the component placement area. For example, the bottom surface of the component is attached to the component carrier. In one embodiment a metal layer disposed on the bottom surface of the component is bonded to the top surface of the component carrier using soldering, eutectic bonding or epoxy bonding. Alternatively, the bottom surface of the component is bonded or glued to the top surface of the component carrier using an adhesive tape, a solder paste or a solder tape.

In step 304, the component carrier contact pads are connected to the component contact pads. Conductive connection elements connect the component carrier contact pads with the component contact pads. For example, conductive clips are used to connect the component contact pads to the component carrier contact pads. The conductive clips may be attached to the sidewalls of the component. In one embodiment the conductive clips are galvanically deposited on the sidewalls. Alternatively, the conductive clips may be clip bonded to the pads. Alternatively, the conductive clips do not attach the sidewalls of the component but provide a small space between the component and the clip along the sidewalls. In one embodiment the conductive connection elements are wire bonds which are wire bonded, ball bonded, or otherwise bonded to the pads.

In step 306, the component, the conductive connection elements and the component carrier are encapsulated using cationic electrophoretic deposition (EPD). For example, a polymer coating encapsulates the component, the component carrier and the conductive connection elements. The polymer coating may comprise an acrylic resin, a polyurethane resin, an epoxy, an epoxy with an anime type hardener or polar high performance thermoplastics. For example, a monomer coating encapsulates the component, the component carrier and the conductive connection elements. Suitable monomers may comprise at least one functional group such as an amine-structure, an acid-structure, a carbonyl-structure, a sulfonate-structure, an isocyanate-structure or a hydroxyl-structure.

Figure 4:
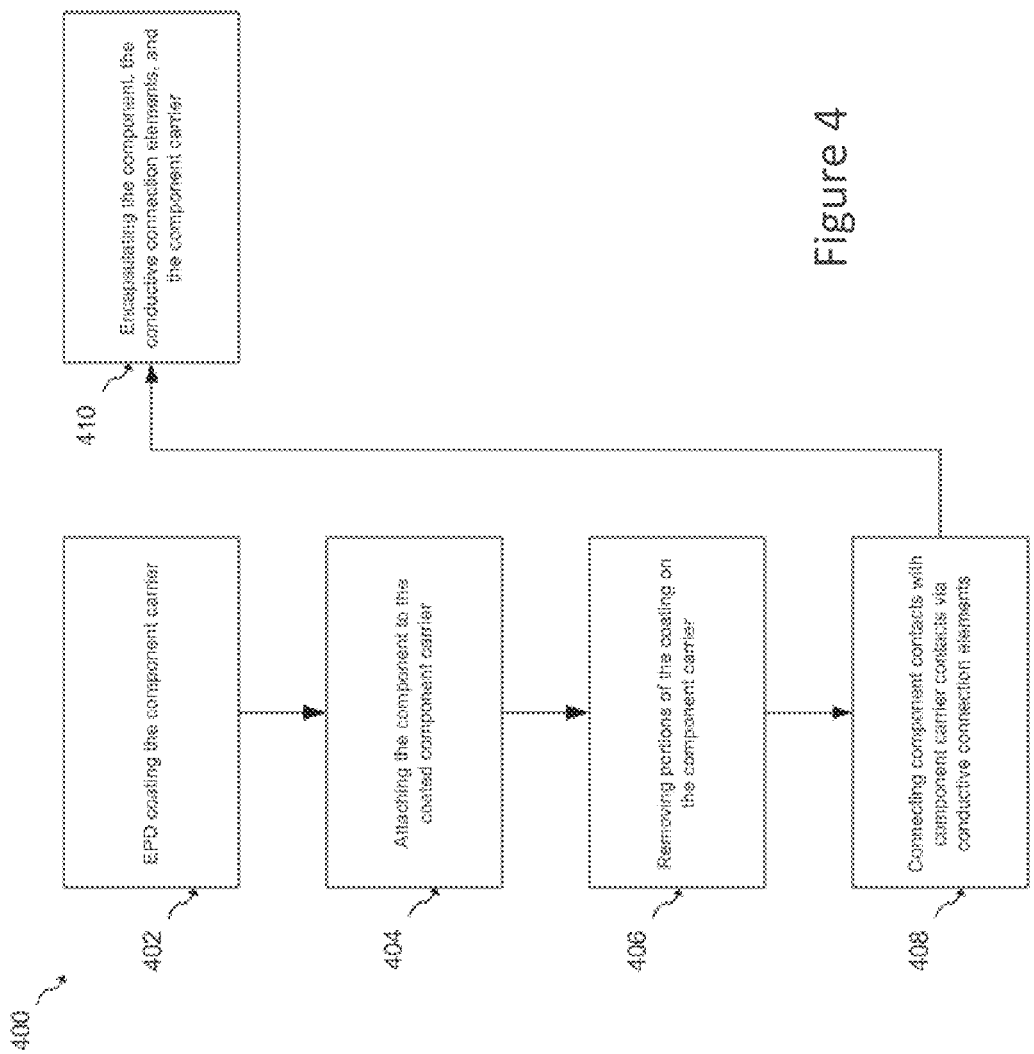
FIG. 4 illustrates an embodiment of a method for manufacturing a packaged component.

FIG. 4 shows an embodiment of a method to manufacture a packaged component 400. In a first step 402, a component carrier is coated with an electrophoretic deposited film. The component carrier may be placed into an EPD bath as described with respect to FIG. 1. An insulating film may be formed on the component carrier. The insulating film may be a thin film or an ultra-thin film. The insulating film may be about 5 µm to about 10 µm thick. Alternatively, the insulating film may be about 10 µm to about 20 µm thick. In one embodiment the insulating film may be less than 50 µm thick.

The component carrier may be a conductive substrate, a leadframe or a printed circuit board with conductive traces on its surface or surfaces. In one embodiment the component carrier is a leadframe comprising a metal such as copper (Cu) or a copper alloy, nickel (Ni) or nickel alloy, silver (Ag) or silver alloys, or a combination thereof. The insulating film may be a polymer film. For example, the polymer film may comprise an acrylic resin, a polyurethane resin, an epoxy, an epoxy with an anime type hardener or polar high performance thermoplastics. Alternatively, the insulating film may be a monomer film. Suitable monomers may comprise at least one functional group like an amine-structure, an acid-structure, a carbonyl-structure, a sulfonate-structure, an isocyanate-structure or a hydroxyl-structure.

Figure 5:
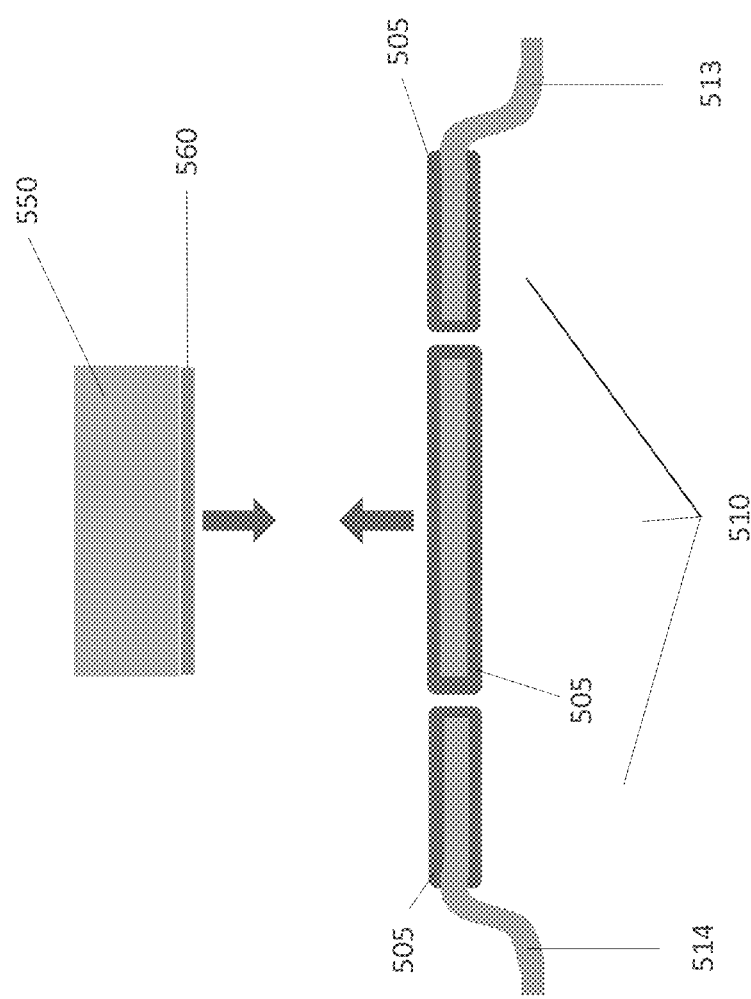
FIG. 5 illustrates an embodiment of a step in the method for manufacturing a packaged component according to FIG. 4.

In step 404 a component is attached to the coated component carrier. FIG. 5 shows this step for a leadframe 510. The component 550 is attached to the EPD coated leadframe 510/505. The component may be the same as described with respect to FIG. 2. The component 550 comprise an insulation layer 560 on it bottom surface.

The EPD film 505 disposed on the leadframe 510 provides an insulating/protective film. Moreover, the EPD film 505 together with the insulation layer 560 provides an excellent mechanical connection. The insulation layer 560 may be adhesive layer. For example, the adhesive layer 560 may comprise epoxy resins, polyimide resins or cyano ester compounds. The adhesive bonding between the component 550 and the leadframe 510 may be obtained via thermo-compression bonding. Bonding parameters may be: Temperature 100-250° C.; bonding force 1-50 N; bonding time 100-1000 ms.

In one embodiment, the adhesive layer 560 and the EPD film 505 may form an interleaved interface. Such an interface forms a strong bond between the component 250 and the component carrier 210. In one embodiment a "polymer-to-polymer" interface may provide a strong interface when the adhesive layer 560 and the EPD film 505 comprise complementary materials. Numerous strong chemical bonds are formed during the attachment process. For example, the EPD based material and the adhesive material may comprise the same time of base resin. Moreover, complementary materials may be isocyanate groups vs. amino or hydroxyl ligands, epoxy vs. amino or carboxylate groups, or ester groups vs. amino ligands.

In step 406 portions of the EPD coating are removed. In one embodiment, the component carrier, e.g., a leadframe, is not coated at the end of the leads 513, 514. The leads 513, 514 are configured to be electrically connected to a conductive terminal and therefore are EPD coating free. The coating 505 is removed from these portions by masking the component carrier 510 and removing the coating 505 portion at the end of the leads 513, 514. Alternatively, the coating 505 is not deposited at the end of leads 513, 514. For example, the component carrier 510 is masked before it is EPD coated. The masking material may be a material which is easily removable, e.g., with a water solution. Moreover, the EPD coating is not deposited at or is removed from areas where the conductive connection elements are connected to the leads.

In step 408, the component carrier contact pads are connected to the component contact pads. Conductive connection elements are connected to the component carrier contact pads and to the component contact pads. For example, conductive clips are connected to the component contact pads with one end and to the component carrier contact pads with the other end. The conductive clips may be attached to the sidewalls of the component. The conductive clips may be clip bonded. Alternatively, the conductive clips do not attach the sidewalls of the component but provide a small space between the component and the clip along the sidewalls. The wire bonds are wire bonded, ball bonded, or otherwise bonded to the pads. The conductive connection elements may be connected to an ESD coating free component carrier contact pad. Alternatively, the conductive connection elements may be connected through the ESD coating of the component carrier contact pads.

In step 410, the component, the conductive connection elements and the component carrier are encapsulated with an encapsulation material. For example, the component, the component carrier and the conductive connection elements are encapsulated with a molding compound. The molding compound may comprise a thermoset material or a thermoplastic material. The molding compound may comprise a coarse grained material. In one embodiment the molding compound may be applied to encapsulate the component and at least portions of the component carrier. Alternatively, the encapsulation material may be a laminate material such as a prepreg material.

Figure 6:
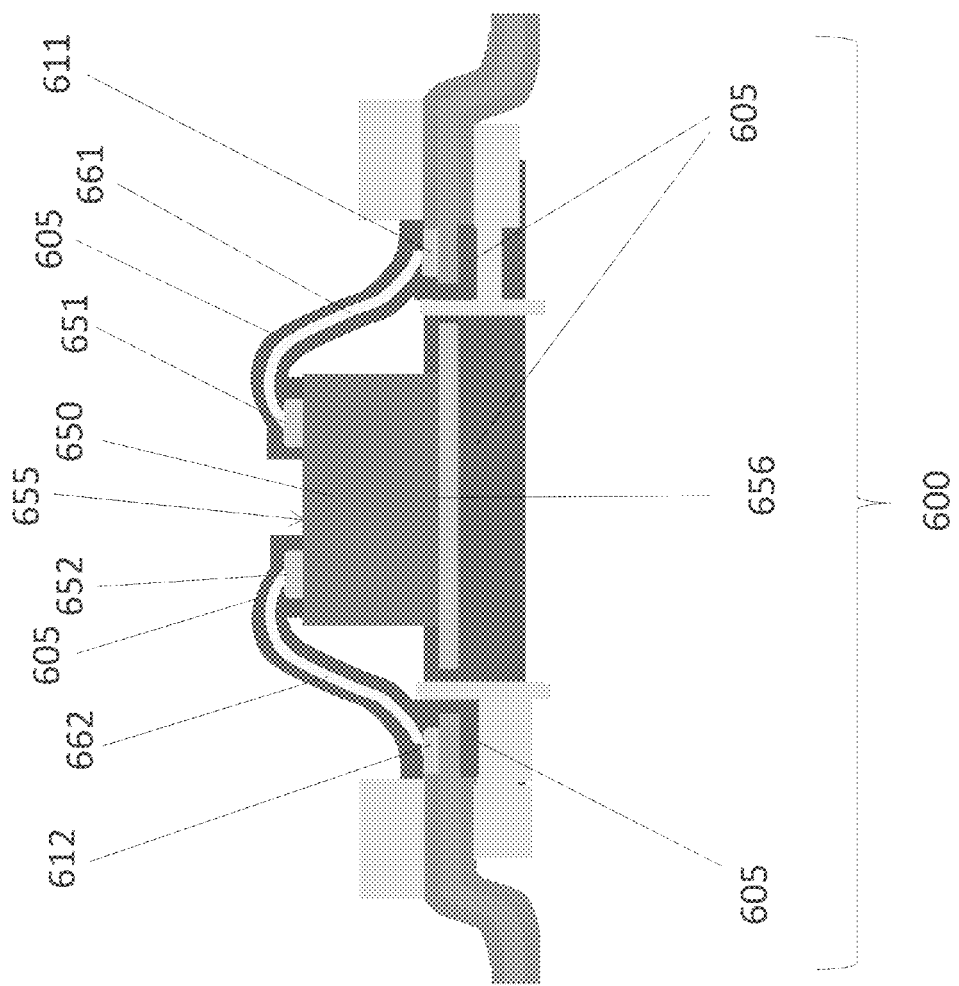
FIG. 6 illustrates in cross-sectional view of an embodiment of a system.

FIG. 6 illustrates a cross-sectional view of an embodiment of system 600 comprising an EPD coating film. The system 600 comprises a component 650 and a component carrier 610.

The component 650 comprises a first main surface or top surface 655 and a second main surface or bottom surface 656. The top surface 655 may be the front side of the component 650 and the bottom surface may be the back side of the component 650. In one embodiment, the first main surface 655 is the surface where the active areas are predominately disposed and the second main surface 656 is the surface which is active area free or which is predominately active area free.

The component 650 comprises a substrate. The substrate may be a semiconductor substrate such as silicon or germanium, or a compound substrate such as SiGe, GaAs, InP, GaN or SiC, or alternatively, other materials. The substrate may be doped or undoped and may comprise one or more wells. The semiconductor substrate may be a single crystal silicon or a silicon-on insulator (SOI). One or more interconnect metallization layers may be arranged on the substrate. A passivation layer is disposed on the interconnect metallization layers to electrically isolate and structure component contact pads of the component 650.

The component 650 may be a chip or die. The component 650 may comprise a discrete device such as a single semiconductor device or an integrated circuit (IC). For example, the component 650 may comprise a semiconductor device such as a MOSFET or a power semiconductor device such as a bipolar transistor, an insulated gate bipolar transistor (IGBT), a power MOSFET, a thyristor or a diode. Alternatively, the component 650 may be a resistor, a protective device, a capacitor, a sensor or a detector, for example. The component may be a system on chip (SoC). In one embodiment the component 650 comprises a discrete device such as a transistor, wherein the top surface 655 comprises a source and the bottom surface 656 comprises a drain. Alternatively, the top surface 655 comprises a drain and the bottom surface 656 comprises a source. Yet in a further embodiment, the top surface 655 comprises a source, drain and electrode.

The component carrier 610 may be a workpiece, a substrate, a leadframe, or a printed circuit board (PCB). In one embodiment the component carrier is a leadframe comprising a metal such as copper (Cu) or a copper alloy, nickel (Ni) or nickel alloy, silver (Ag) or silver alloys, or a combination thereof.

The bottom surface 656 of the component is attached to the component carrier 610. In one embodiment the metal layer is bonded to the top surface of the component carrier using a soldering, eutectic bonding or an epoxy bonding. Alternatively, the second main surface 656 of the component is bonded or glued to the top surface of the carrier using an adhesive tape, a solder paste or a solder. In one embodiment the connection between the component and the component carrier is an electrical connection. Alternatively, the connection is an insulating barrier.

The system 600 further comprises connection elements 661, 662 such as conductive clips or wire bonds. For example, component contacts or component contact pads 651, 652 disposed on the top surface 655 of the component 650 are bonded to component carrier contacts or component carrier contact pads 611, 612 of the component carrier 610. The component contacts 651, 652 of the component are wire bonded, ball bonded, clip bonded or otherwise bonded to the contacts of the component carrier. The wires or conductive clips 661, 662 comprise a metal such as aluminum (Al), copper (Cu), silver (Ag) or gold (Au).

The system 600 further comprises an EPD coating 605. The EPD coating 605 is disposed on all conductive or all metallic surfaces of the system 600. For example, the EPD coating 605 may cover the connection elements 661, 662, the top surface 655, the component carrier surfaces (e.g., lead frame) such as the component carrier contacts (e.g., leads). In one embodiment the EPD coating 605 may cover only selected portions of the metallic surfaces.

System 600 may comprise a polymer coating 605 on component contact pads 651, 652, the component carrier contact pads 611, 612, and the conductive connection elements 661, 662 between the component contact pads and the component carrier contact pads. Other electrically conductive surfaces of the component 650 may also covered with the polymer film 605. In one embodiment surface portions of the leads 613/614 are not covered with the polymer film 605.

The EPD film 605 may be an electrically insulating film and may comprise a layer thickness of below about 20 µm. Alternatively, the EPD film 605 may comprise a layer thickness of about 20 µm to about 50 µm. The insulating film 605 may provide protection of conductive portions of the packaged device 200. The insulating film 205 may protect against corrosion for example.

Figure 7:
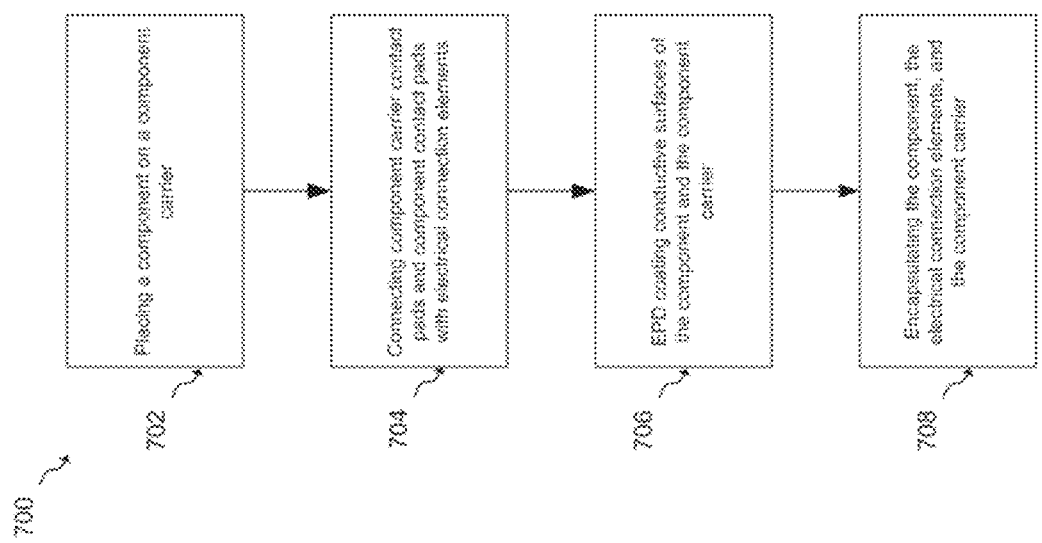
FIG. 7 illustrates an embodiment of a method for manufacturing the system.

FIG. 7 shows an embodiment of a method to manufacture a packaged component 700. In a first step 702, a component is placed on and attached to a component carrier. The component and the component carrier may be the same as described with respect to FIG. 6.

The bottom surface of the component is attached to the component carrier. In one embodiment a metal layer disposed on the bottom surface of the component is bonded to the top surface of the component carrier using soldering, eutectic bonding or epoxy bonding. Alternatively, the bottom surface of the component is bonded or glued to the top surface of the component carrier using an adhesive tape, a solder paste or a solder tape.

In step 704, component carrier contact pads are connected to the component contact pads. Conductive connection elements connect the component carrier contact pads with the component contact pads. For example, the conductive connection elements are conductive clips or bond wires. The conductive connection elements may be wire bonded, ball bonded, clip bonded or otherwise bonded.

In step 706, the conductive surfaces of the component, the component carrier and the conductive connection elements are coated with an insulating material using cationic electrophoretic deposition (EPD). For example, the system may be disposed in an electrophoretic deposition (EPD) tool as described with respect to FIG. 1. The system may be coated with a thin film or an ultra-thin film. The thin film or ultra-thin film may comprise material similar to previous embodiments. The insulating film may be about 5 µm to about 10 µm thick. Alternatively, the insulating film may be less than 20 µm thick.

In one embodiment the EPD film may coat the leadframe, the conductive connection elements and the top surface of the component. For example, the leadframe is coated at the component attach area except where the component is attached to the leadframe. The leadframe is further coated with the EPD film on the leads except where the leads are connected to the conductive connection elements and except where the leads are configured to be bonded to a further carrier or substrate. The component is EPD coated over the entire top surface except where the conductive connection elements are connected to the component contacts. In one embodiment the component is only EPD coated at the small component contact pad but not over the entire to surface of the component.

In one embodiment only the top surface of the component is EPD coated. Alternatively, only the conductive connection elements are coated. Moreover, any metallic surfaces of the system (component, component carrier and conductive connection elements) can be chosen to be EPD coated. For example the top surface of the component and the conductive connection elements are EPD coated while the component carrier is not (e.g., because the component is a non-conductive substrate or the component carrier is masked).

In step 708, the component, the component carrier and the conductive connection elements are encapsulated. For example, the component, the component carrier and the conductive connection elements are encapsulated with a molding compound. The molding compound may comprise a thermoset material or a thermoplastic material. The molding compound may comprise a coarse grained material. In one embodiment the molding compound may be applied to encapsulate the component and at least portions of the component carrier. Alternatively, the encapsulation material may be a laminate material such as a prepreg material.

An advantage of the EPD technique is fast polymer or monomer coating of semiconductor packages, systems or devices. In particular, the semiconductor packages, systems or devices can be processed in parallel and in large numbers. In comparison to other coating techniques heat does not need to be applied. Accordingly, thermo-mechanical stress during coating is reduced to a minimum. For example, warpages for leadframes during alternative coating processing could be prevented by the EPD technique. Another advantage is the ability of an equally coating of topographical surfaces including surfaces of small vias.

In some embodiment, curing temperatures or after deposition temperatures for EPD-generated films may be at a substantially lower temperature than curing or after deposition temperatures of conventional encapsulation materials. For example, EPD film temperatures may be between 50° C. and 100° C. while conventional encapsulations material temperatures may be over 150° C. Lower deposition temperature may result in lower thermal stress between the disposed material and the workpiece. Furthermore, thermal stress may be significantly alleviated by the incorporation of polycyclic compounds in the base resins of the EPD polymers. Such resin modifications may lower the CTEs of EPD-generated film materials by a factor of two or more.

In some embodiments, the shift towards a lower CTE may be achieved by incorporating polycyclic aromatic moieties (naphthalene, anthracene, phenanthrene, perylene, pyrene, etc.) in the base resin. A polyimide type resin comprising a polycyclic compound exhibits a CTE of 20.0 ppm/K which is very close to the CTE values of wire bond materials, for example.

In some embodiments, the EPD process provides more material choices for encapsulants than traditional molding processes. For example, the base resin chemistry for an EPD process provides a wide variety of polymer options to choose from. Contrary to molding processes the polymer materials are not limited to materials having a deposition temperature of above 150° C. Moreover, the EPD materials may have a lower viscosity at the operation temperature than traditional materials because the EPD materials are deposited employing a liquid medium. Due to the relaxation of the selection criteria base resin choices for EPD coating may include not only commonly used polymer types like epoxy or polyacrylate resins but also high performance thermoplastic materials like polycarbonates, polyamides, polyamides-imides, polysulfones, or fluorinated conjugated polymers.

In some embodiments, the use of high performance polymers promises advantages regarding heat resistance, dimensional stability, chemical resistance and creep resistance. Since EPD-applicable resins must be able to carry charges in the suspension medium, the base resin materials may be modified to incorporate functionalities/ligands which are either inherently ionic or become ionic after suspension of the polymer particles in the EPD bath.

The nature of the charge-providing ligands is different for cationic and anionic EPD applications. For example, polymers for cationic EPD may comprise quarternary ammonium groups or amino groups which convert into ammonium ligands after being protonated in the presence of a low concentration of acid (e.g. formic, acetic, proprionic, butyric, nitric or hydrochloric acid) in the suspension liquid.

Alternatively positive charging of polymer entities may also derive from phosphonium or sulfonium ligands. In the case of anionic EPD the polymers may comprise carboxylate or sulfonate groups, or acidic OH functionalities (e.g. phenolic groups). Epoxy, polyacrylate or polybutadiene compounds may be employed as base resins in film materials which can be used for either cationic or anionic EPD. Maleic resins, on the other hand, are typically only used for anionic EPD, while polyurethanes are preferentially employed in film materials designed for cationic EPD applications.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a packaged component, the method comprising:
   placing a component on a component carrier;
   connecting a conductive connection element to a component contact of the component and to a component carrier contact of the component carrier; then,
   electrophoretically depositing an insulating film on at least one of the component, the conductive connection element and the component, carrier, wherein the insulating film is an polyurethane resin or a polar high performance thermoplastic; and
   encapsulating the component, the conductive connection element and the component carrier with a molding compound.

2. The method according to claim 1, wherein the component comprises a first metal on a surface, wherein the conductive connection element comprises a second metal, and wherein the component carrier comprises a third metal.

3. The method according to claim 1, wherein the component carrier is a leadframe, wherein the conductive connection element is a bond wire or a clip, and wherein the component comprises a discrete device or an integrated circuit (IC).

4. The method according to claim 1, wherein the component comprises a thickness of less than about 20 μm, and wherein the insulating film comprises a thickness of less than about 50 μm.

5. The method according to claim 1, wherein the component comprises a thickness of about 20 μm to about 50 μm, and wherein the insulating film comprises a thickness of about 5 μm to about 10 μm.

6. The method according to claim 1, wherein encapsulating the component comprises encapsulating the component with a laminate material.

7. The method according to claim 1, further comprising curing the insulating film.

8. The method according to claim 1, wherein curing comprises curing the insulating film between 50° C. and 100° C.

9. The method according to claim 1, wherein electrophoretically depositing comprises placing the component, the conductive connection element and the component carrier in an electrophoretic deposition tool.

10. The method according to claim 9, wherein electrophoretically depositing comprises moving electrically charged insulating particles towards the component, the conductive connection element and the component carrier.

11. The method according to claim 10, wherein electrophoretically depositing comprises electrically discharging the electrically charged insulating particles on the at least one of the component, the conductive connection element and the component carrier thereby forming the insulating film.

12. A method for manufacturing a packaged component, the method comprising:

placing a component on a component carrier;

connecting a conductive connection element to a component contact of the component and to a component carrier contact of the component carrier; then, electrophoretically depositing an insulating film on at least one of the component, conductive connection element and the component, carrier, wherein the insulating film is an epoxy film; and encapsulating the component, the conductive connection element and the component carrier with a molding compound.

13. The method according to claim 12, wherein the epoxy film comprises an epoxy with an anime type hardener.

14. A method for manufacturing a packaged component, the method comprising:

placing a component on a component carrier;

connecting a conductive connection element to a component contact of the component and to a component carrier contact of the component carrier; then, electrophoretically depositing an insulating film on at least one of the component, the conductive connection element and the component carrier, wherein the insulating film is based on a monomer, and wherein the monomer comprises at least one functional structure from the group consisting of an acid-structure, a carbonyl-structure, a sulfonate-structure, an isocyanate-structure and a hydroxyl-structure; and encapsulating the component, the conductive connection element and the component carrier with a molding compound.

* * * * *